Sept. 6, 1966 H. C. STAEHLE ETAL 3,271,151

PHOTOGRAPHIC RELIEF PRINTING PLATE

Filed Feb. 8, 1965

HENRY C. STAEHLE
ALBERT C. SMITH
INVENTORS

BY R. Frank Smith
Henry E. Byers
ATTORNEYS

United States Patent Office 3,271,151
Patented Sept. 6, 1966

3,271,151
PHOTOGRAPHIC RELIEF PRINTING PLATE

Henry C. Staehle and Albert C. Smith, Rochester, N.Y., assignors to Eastman Kodak Company, Rochester, N.Y., a corporation of New Jersey Filed Feb. 8, 1965, Ser. No. 431,035
26 Claims. (Cl. 96—36.3)

This invention concerns a silver halide emulsion on a relief printing plate, more particularly, the emulsion layer on a relief printing plate obtained by deep etching a cellulose ester support by means of an integral resist image prepared by photographic means.

Photographic relief printing plates are well known since it has been relatively easy to obtain a photographic image in hardened colloid which could be prepared in a relief form by washing or removing the unhardened areas of the photographic emulsion.

To prepare conventional relief printing plates for direct or indirect printing having considerable relief, a photographic image has been formed on a metal surface after which the metal has been etched in the non-image areas. However, this method requires precautionary measures to reduce undercutting of the resist areas while the plates are being etched to sufficient depth in the non-image areas.

"Powdering" or "staging" techniques, e.g., involving application of dragon's blood, and the use of emulsified solvents, are common with metal plates. In spite of these techniques, these metal plates often lack detail due to the undercutting or removal of the dot areas. Moreover, the process of preparing metal plates has been relatively expensive. Therefore, it has been desirable to make printing plates for direct printing having better detail and less cost than the conventional metal plates.

Attempts have been made in the past to prepare plastic relief printing plates by photographic means involving formation of a colloid resist image on a plastic layer, followed by solvent treatment of the unprotected areas useful in typographic or intaglio printing.

In the Baxter and Staehle application Serial No. 269,-345, filed April 1, 1963, incorporated herein by reference, a relief printing plate is described which achieves a high degree of success in providing a plastic relief printing plate by etching through a photographic image into the plastic support. A relief image is formed photographically in a light sensitive colloid, unexposed areas removed and a cellulose ester support attacked with a solvent mixture in a cyclical process involving the steps of etching, removing the solvent, drying and re-etching until the plastic has been etched to a satisfactory depth. For most purposes, the plastic support is attached to a metal base such as steel, etc.

The exposure of the light sensitive colloid emulsion is usually made either to a line image such as a typed image having high contrast or to a half-tone image. A typical image of this type would be a typewritten image on a white surface. To copy an image having gray areas, a screen is used and the exposure made through the screen. This results in an image comprised of small dots, the quantity of the dots being greater in the more dense areas than in the lighter or less dense areas. The degree of reproduction of a given relief printing plate controls the fineness of the dots which can be used. Successful operation in reproducing the smaller dots, such as the small dots in the highlight areas, for long press runs, depends on the preservation of these dots. Wearing away of the dots diminished the faithfulness of the reproduction.

These plastic relief printing plates yield very high quality prints, but the printing surface may have inadequate press life for extremely long press runs. For example, one million to several million prints are sometimes made from a single plate.

Attempts have been made to improve the press life of the colloid printing surface (1) by cross linking the colloid, such as gelatin, using insolubilizing agents, for example, aldehydes, incorporated in the emulsion or added in processing, (2) by the addition of plasticizers to improve the elasticity of the colloid and (3) by the use of special bonding techniques to insure that the colloid remains securely adherent to the underlying plastic, even on the half-tone dots found in the highlight areas of the printing plate. However, even the optimum combination of these approaches has not been successful in providing a printing plate having sufficiently long press runs for certain purposes.

We have found that the incorporation in the colloid emulsion of certain particulate matter improves the adhesion of the colloid relief image and enhances the durability of the image for extremely long press life.

One object of our invention is to provide an improved silver halide sensitized colloid for forming plastic photoengravings. Another object is to provide an improved plastic photoengraving for typography presenting a printing surface with outstanding press life. A further object is to provide a method of improving the adhesion and durability of a gelatin relief image on a plastic support for use in typography. Other objects will be evident from the following description of our invention.

The above objects are attained by adding to the colloid silver halide photosensitive layer finely divided particulate solid matter of an average diameter of 2 to 20 microns and of a high degree of hardness. Particularly useful materials have a hardness on the Moh scale between 5 and 10 and an average particle size of 2 to 8 microns in diameter. A particularly useful concentration is from about 50 to 750 g./lb. of colloid in the emulsion coated at about 25 mg. to 1,000 mg./sq. ft. and preferably 100 to 500 mg./sq. ft.

While the specific composition of the particulate matter is not critical provided it is inert with the respect to the silver halide emulsion, the following illustrate the type of particulate materials which can be used in our invention:

| Addenda: | Moh hardness |
|---|---|
| Agate | 6–7 |
| Alundum | 9 |
| Asbestos | 5 |
| Beryl | 7–8 |
| Calamine | 5 |
| Carborundum | 9–10 |
| Corundum | 9 |
| Emery | 7–9 |
| Flint | 7 |
| Glass | 4.5–6.5 |
| Quartz | 7 |
| Spinel | 8 |

Various modifications of the relief printing plate structure under the silver halide emulsion have been proposed. For instance, in the Starck et al. U.S. application, Serial No. 414,291, filed November 27, 1964, incorporated hereing by reference, the overlayer material under the thin subbing layer is disclosed as being made preferably of cellulose acetate propionate, having a solubility of about 7 to 11.5 g./liter in the semisolvent, coated over a cellulose acetate butyrate support, having a solubility of about 14 to 18 g./liter in the semisolvent used to etch the support and overlayer(s). Moreover, it is indicated that the particular plastic strata may be varied provided the solubility relationship is preserved. Such organic polymeric materials, as for example, cellulose esters, polyamides, polyesters, polyacrylics, polycarbonates, polyolefins, polymethanes, polyvinyls, condensation and addition polymers, etc., may be used. Of course, the plastic structure is preferably of compatible plastic materials to obtain suitable adhesion between the various layers.

Pigments may be used in pigmenting the layers, such as titanium dioxide, etc, but these are not critical and include those customarily used for pigmenting plastic materials.

The silver halide emulsion must be processed to a hardened resist image and if unhardened emulsions are used, the tanning agents may be incorporated in the emulsion or included in the processing solutions. If hardened emulsions are used, the resist image is formed by an etch bleach process.

In a typical embodiment of this invention, the use of a silver halide emulsion containing a susbtantially water-insoluble tanning developing agent is advantageous. Such an emulsion is coated over the top layer on the support which contains no hardening agent for the emulsion and is adapted to give good adhesion to the emulsion by means of an extremely thin subbing layer, such as, for example, a mixture of cellulose nitrate and gelatin. A typical emulsion containing a tanning developing agent is described in column 3, lines 3 et seq. of U.S. Patent 2,596,756, issued May 13, 1952.

In the embodiment where in the emulsions are substantially unhardened emulsions, they preferably have a hardness of gelatin which contains up to 0.7 gram of dry formaldehyde per pound of dry freshly coated gelatin to reduce abrasion during handling, packaging and storage, or 0.1 ounce of formalin (40% formaldehyde solution) per pound of gelatin for a sample aged 3 to 6 months.

It will be appreciated that the silver halide emulsion may be one of those conventionally used in preparing light sensitive coatings, such as silver chloride, silver bromide, silver iodide, silver chlorobromide, silver chloroiodide, silver bromoiodide, silver chlorobromoiodide.

The colloid in which the light sensitive silver salt is dispersed must be one of those which can be hardened to form a relief image. Such colloids include gelatin or similar protein, polyvinyl alcohol, polyacrylic resin, or the like, known in the art.

Tanning developing agents include hydroquinone and substituted hydroquinone such as bromohydroquinone, chlorohydroquinone, tolylhydroquinone, and the like. Also, useful tanning developing agents are the dihydroxy diphenyl tanning developing agents disclosed in Yackel U.S. 2,592,368, issued April 8, 1952, catechols such as 4-phenyl catechol, etc.

Auxiliary developing agents may also be used in conjunction with the tanning developing agent, such as ascorbic acid, pyrazolidones such as 1-phenyl-3-pyrazolidone, etc.

It will be appreciated that various addenda may also be used in the silver halide emulsions which are known in the arts, such as chemical and spectral sensitizers, antifoggants, stabilizers, coating aids, etc.

The silver halide coverage in the emulsion depends upon the particular use for which it is intended, for instance, whether the exposure is to be to a halftone image, lighting conditions, contact or projection speed, etc. However, a useful coverage may be from 50 mg. to 400 mg. of silver halide per sq. ft.

The following examples are intended to illustrate our invention but not to limit it in any way:

*Example 1*

A cellulose acetate propionate film of 0.013 inch thickness containing sufficient titanium dioxide pigment to make the coating opaque was laminated to a support sheet of 0.015 inch steel plate bearing a polyvinyl acetate resin adhesive coating about 0.002 inch thick. The top exposed surface of the acetate propionate layer was provided with a cellulose nitrate subbing layer of less than 0.0005 inch. Three portions of this support were then coated as follows: The first portion was coated with a gelatin silver halide to a dried thickness of 0.0005 inch of a gelatin silver chloride emulsion of the type described in Example 3 of U.S. Patent 2,596,756. The second portion was coated to the same dried thickness with the same emulsion modified by the addition of 100 grams per pound of dried coating of magnesium silicate (talc) having an average particle size of 4 microns diameter. The third portion was similarly coated, the emulsion containing instead of the talc, 100 grams per pound of dried coating, of silicon dioxide having an average particle size of 4-microns diameter.

The three coatings were exposed to a halftone negative for 20 seconds using a 100-watt lamp at a distance of 2 feet. The coatings were each developed in a tanning developer which consisted of equal parts of two solutions.

| | | Grams |
|---|---|---|
| (a) | Catechol | [1] 5 |
| | Sodium bisulfite | [1] 1 |
| (b) | Sodium hydroxide | [1] 25 |
| | Potassium bromide | [1] 2 |

[1] In 500 ml. of water.

Development took place for 2 minutes at 75° F. It was followed by a short rinse in a 1 percent acetic acid stop bath. A warm water spray at 100° F. was used to wash out unhardened emulsion leaving a hardened gel image in the areas which had been exposed. The plate was dried. The black image areas were boldly revealed against the white background of the pigmented layer.

Etching a relief image was carried out on a drum arrangement which mechanized the alternate application of solvent, rubbing action, removal of loose swollen material and drying. The plate was attached to a cylinder for the etch operation. The etch cycle began with scrubbing action due to an oscillating of the scrubber pad of a pile fabric (nylon) mounted on an axis parallel to the cylinder. The etchant, 3 parts ethyl acetate and 1 part ethyl alcohol, was applied through slots in the center of the scrubber pad. As the cylinder rotated, an alcohol rinse to stop the solvent action was applied immediately beyond the swab area. Halfway through the cycle the used etchant and dissolved plate material were removed by a rubber squeegee blade. This was followed by impingement of heated air supplied by several heat guns to remove essentially all of the solvent and dry the plate before the beginning of the next cycle. One complete cycle took approximately one-half minute with about 15 seconds for etching and scrubbing, 10 seconds for stopping the etch and removal of material with the remaining time used for drying.

After 15 cycles, the plates had been etched to a depth of 0.010 inch. There was no appreciable difference in the etch depth of the three plates.

All three plates were run on the same printing press using identical inks, roller pressure, speeds, etc. After 300,000 prints had been made with each plate, it was observed that the quality of the printed image was higher for the plates containing the added silicon dioxide in the emulsion layer. The plate containing the talc appeared to be similar to the control plate which showed some breakdown of the image, particularly in areas of fine detail, but also in broad dense areas. The plate having the incorporated silicon dioxide was put back on the press and the run was continued until more than one-half million copies were printed.

*Example 2*

An aluminum plate 0.003" was laminated to a photosensitive element consisting of a subbed acetate-butyrate support 0.020" coated with a gelatin layer containing:

| | Mg. per sq. ft. |
|---|---|
| Gelatin | 520 |
| 4-phenyl catechol | 80 |
| Alundum 38–900 [1] (electronic grade) | 520 |
| Silver chloride | 165 |

[1] Alundum is a registered trademark of the Norton Company, Worcester, Mass. for fused aluminum refractories. The electronic grade is the highest degree of purity being at least 99% aluminum oxide.

The average particle diameter of the Alundum 38–900 was about 15 microns.

After exposure through a photographic negative containing both fine line and dot detail, the plate was immersed for 1 minute in an activator consisting of sodium metaborate at 250 grams per liter. The plate was then washed with warm water to remove the unhardened gelatin areas, after which it was dried by forced warm air. The plate was etched as described in Example 1 to a depth of 0.015 inch. The plate was used on a Hamilton Web Offset press to print over 250,000 impressions. The highlight and shadow dots were particularly sharp and well reproduced. Examination with a microscope of the dot structure showed a steep sidewall slope.

In the attached diagram are shown diagrammatic representations of a typical printing plate prepared according to our invention.

FIG. 1 shows the plate prior to formation of the relief image comprising an unhardened emulsion layer 11 having incorporated therein hard particulate material coated over a thin subbing layer 12, a layer of clear cellulose acetate propionate 13, a layer of pigmented cellulose acetate propionate 14 and an extra thick cellulose acetate butyrate layer 15. This cellulose ester layer is adhered by means of an adhesive layer 16 to a rigid or semirigid base 17.

Figure 1:
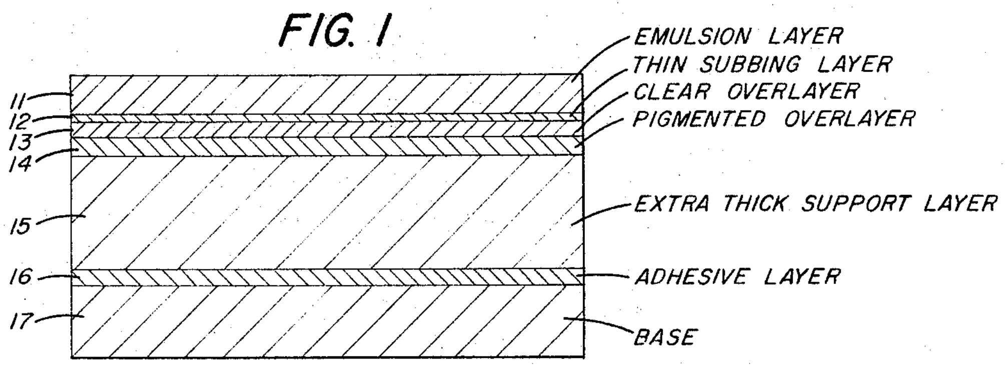
Figure 2:
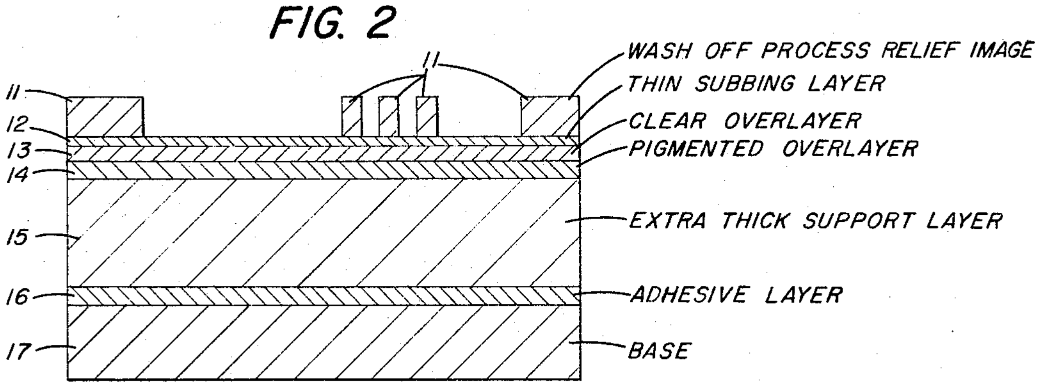
FIG. 2 shows the same printing plate as illustrated in FIG. 1 after processing the exposed silver halide emulsion with a tanning developing agent and washing off the untanned areas of the emulsion layer.
Figure 3:
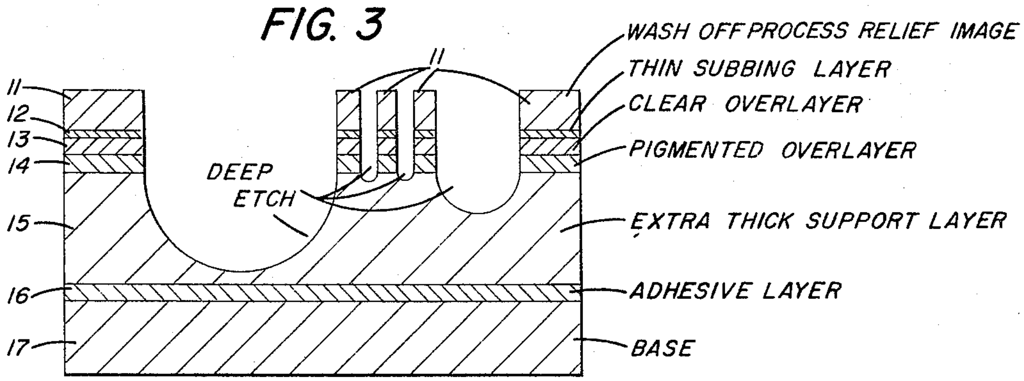
FIG. 3 shows the same printing plate as described in FIG. 2 after the etching step, ready for use on the printing press.

The invention has been described in detail with particular reference to preferred embodiments thereof, but it will be understood that variations and modifications can be effected within the spirit and scope of the invention as described hereinabove and as defined in the appended claims.

We claim:

1. A photosensitive element for preparing plastic relief printing plates by etching the plastic imagewise with a semisolvent for the plastic, comprising an organic plastic support having a thickness of about 8 to 40 mils, having thereon a silver halide, light sensitive emulsion adhered to the support by means of a thin subbing layer no thicker than that having a coverage of about 0.020 gram per square foot and capable of being etched imagewise by a semisolvent for the plastic, said emulsion comprising a colloidal dispersion of light sensitive silver halide in an alkali permeable colloid and containing inert particulate solid matter of a high degree of hardness.

2. A photosensitive element for preparing plastic relief printing plates by etching the plastic imagewise with a semisolvent for the plastic, comprising an organic plastic support having a thickness of about 8 to 40 mils, having thereon a silver halide, light sensitive emulsion adhered to the support by means of a thin subbing layer no thicker than that having a coverage of about 0.020 gram per square foot and capable of being etched imagewise by the semisolvent for the support, said emulsion comprising a colloidal dispersion of light sensitive silver halide in an alkali permeable colloid and containing inert particulate solid matter having a hardness on the Moh scale between 5 and 10.

3. A photosensitive element for preparing relief printing plates by etching the support imagewise with a semisolvent for the support, comprising a cellulose ester support having a thickness of about 8 to 40 mils, having thereon a silver halide, light sensitive emulsion strongly adhered to the support by means of a thin subbing layer no thicker than that having a coverage of about 0.020 gram per square foot and capable of being etched imagewise by a semisolvent for the cellulose ester, said emulsion comprising a colloidal dispersion of light sensitive silver halide in an alkali permeable colloid and containing inert particulate solid matter having a hardness on the Moh scale between 5 and 10 having an average particle size of 2 to 20 microns in diameter.

4. A photosensitive element for preparing plastic relief printing plates by etching the plastic imagewise with a semisolvent for the plastic, comprising a cellulose ester support having a thickness of about 8 to 40 mils, having thereon a silver halide, light sensitive emulsion adhered to the support by means of a thin subbing layer no thicker than that having a coverage of about 0.020 gram per square foot and capable of being etched imagewise by a semisolvent for the plastic, said emulsion comprising a colloidal dispersion of light sensitive silver halide in an alkali permeable colloid and containing inert particulate solid matter having a hardness on the Moh scale between 5 and 10, having an average particle size of 2 to 20 microns in diameter and having a concentration in the emulsion of 50 to 750 grams per pound of gelatin.

5. A photosensitive element for preparing plastic relief printing plates by etching the plastic imagewise with a semisolvent for the plastic, comprising a cellulose acetate butyrate support having a thickness of about 8 to 40 mils, having thereon a gelatino silver halide, light sensitive emulsion strongly adhered to the support by means of a thin subbing layer no thickner than that having a coverage of about 0.020 gram per square foot and capable of being etched imagewise by the semisolvent for the support, said emulsion containing particulate solid matter of a high degree of hardness.

6. A photosensitive element for preparing plastic relief printing plates by etching the plastic imagewise with a semisolvent for the plastic, comprising an organic plastic support having a thickness of about 8 to 40 mils, having thereon an organic plastic overlayer of less solubility in the semisolvent than the support, having thereon a silver halide, light sensitive emulsion adhered to the overlayer by means of a thin subbing layer no thicker than that having a coverage of about 0.020 gram per square foot and capable of being etched imagewise by a semisolvent for the plastic said emulsion containing particulate solid matter having a hardness on the Moh scale between 5 and 10.

7. A photosensitive element for preparing plastic relief printing plates by etching the plastic imagewise with a semisolvent for the plastic, comprising an organic plastic support having a thickness of about 8 to 40 mils, having thereon at least one organic plastic overlayer of less solubility in the semisolvent than the support, having thereon a silver halide, light sensitive emulsion adhered to the overlayer by means of a thin subbing layer no thicker than that having a coverage of about 0.020 gram per square foot and capable of being etched imagewise by a semisolvent for the plastic, said emulsion containing particulate solid matter having a hardness on the Moh scale between 5 and 10 and an average particle size of 2 to 20 microns in diameter.

8. A photosensitive element for preparing plastic relief printing plates by etching the plastic imagewise with a semisolvent for the plastic, comprising an organic plastic support having a thickness of about 8 to 40 mils, having thereon at least one organic plastic overlayer of less solubility than the support, having thereon a silver halide, light sensitive emulsion adhered to the overlayer by means of a thin subbing layer no thicker than that having a coverage of about 0.020 gram per square foot and capable of being etched imagewise by the semisolvent for the support, said emulsion containing particulate solid matter having a hardness on the Moh scale between 5 and 10 and an average particle size of 2 to 20 microns in diameter at a concentration of 50 to 750 grams per pound of gelatin in the emulsion.

9. A photosensitive element for preparing relief printing plates by etching the support imagewise with a semisolvent for the support, comprising an organic plastic support having a thickness of about 8 to 40 mils, having thereon at least one organic plastic overlayer having less solubility in the semisolvent than the support and having thereon a substantially unhardened gelatino silver halide, light sensitive emulsion adhered to the overlayer by means of a thin subbing layer no thicker than that having a coverage of about 0.020 gram per square foot and capable of being etched imagewise by a semisolvent for the organic plastic, said emulsion containing a silver halide tanning type developing agent and finely divided particulate solid matter of a high degree of hardness.

10. A photosensitive element for preparing plastic relief printing plates by etching the plastic imagewise with a semisolvent for the plastic, comprising an organic plastic support having a thickness of about 8 to 40 mils, having thereon at least one organic plastic overlayer of less solubility in the semisolvent than the support, having thereon a substantially unhardened silver halide, light sensitive emulsion adhered to the overlayer by means of a thin subbing layer no thicker than that having a coverage of about 0.020 gram per square foot and capable of being etched imagewise by a semisolvent for the plastic, said emulsion containing a tanning type silver halide developing agent and particulate solid matter having a hardness on the Moh scale between 5 and 10.

11. A photosensitive element for preparing plastic relief printing plates by etching the plastic imagewise with a semisolvent for the plastic, comprising an organic plastic support having a thickness of about 8 to 40 mils, having thereon at least one organic plastic overlayer of less solubility in the semisolvent than the support, having thereon a substantially unhardened gelatino silver halide, light sensitive emulsion adhered to the overlayer by means of a thin subbing layer no thicker than that having a coverage of about 0.020 gram per square foot and capable of being etched imagewise by the semisolvent for the support, said emulsion containing a tanning type silver halide developing agent and containing particulate solid matter having a hardness on the Moh scale between 5 and 10 and an average particle size of 2 to 20 microns in diameter.

12. A photosensitive element for preparing plastic relief printing plates by etching the plastic imagewise with a semisolvent for the plastic, comprising an organic plastic support having a thickness of about 8 to 40 mils, having thereon at least one organic plastic overlayer of less solubility in the semisolvent than the support, having thereon a substantially unhardened gelatino silver halide, light sensitive emulsion adhered to the overlayer by means of a thin subbing layer no thicker than that having a coverage of about 0.020 gram per square foot and capable of being etched imagewise by a semisolvent for the plastic, said emulsion containing a tanning type silver halide developing agent and containing particulate solid matter having a hardness on the Moh scale between 5 and 10 and an average particle size of 2 to 20 microns in diameter at a concentration of 50 to 750 grams per pound of gelatin in the emulsion.

13. A photosensitive element for preparing plastic relief printing plates by etching the plastic imagewise with a semisolvent for the plastic, comprising a cellulose ester support having a thickness of about 8 to 40 mils, having thereon at least one organic plastic overlayer of less solubility in the semisolvent than the support, having thereon a substantially unhardened gelatino silver halide, light sensitive emulsion adhered to the overlayer by means of a thin subbing layer no thicker than that having a coverage of about 0.020 gram per square foot and capable of being etched imagewise by a semisolvent for the plastic, said emulsion containing a silver halide tanning type developing agent and finely divided particulate solid matter of a high degree of hardness.

14. A photosensitive element for preparing plastic relief printing plates by etching the plastic imagewise with a semisolvent for the plastic, comprising a cellulose ester support having a thickness of about 8 to 40 mils, having thereon at least one organic plastic overlayer of less solubility in the semisolvent than the support, having thereon a substantially unhardened gelatino silver halide, light sensitive emulsion adhered to the overlayer by means of a thin subbing layer no thicker than that having a coverage of about 0.020 gram per square foot and capable of being etched imagewise by the semisolvent for the support ,said emulsion containing a tanning type silver halide developing agent and containing particulate solid matter having a hardness on the Moh scale between 5 and 10.

15. A photosensitive element for preparing relief printing plates by etching the support imagewise with a semisolvent for the support, comprising a cellulose ester support having a thickness of about 8 to 40 mils, having thereon at least one organic plastic overlayer having less solubility in the semisolvent than the cellulose ester support and having thereon a substantially unhardened gelatino silver halide, light sensitive emulsion adhered to the overlayer by means of a thin subbing layer no thicker than that having a coverage of about 0.020 gram per square foot and capable of being etched imagewise by a semisolvent for the cellulose ester, said emulsion containing a tanning type silver halide developing agent and containing particulate solid matter having a hardness on the Moh scale between 5 and 10 and an average particle size of 2 to 20 microns in diameter.

16. A photosensitive element for preparing plastic relief printing plates by etching the plastic imagewise with a semisolvent for the plastic, comprising a cellulose ester support having a thickness of about 8 to 40 mils, having thereon at least one cellulose ester overlayer of less solubility in the semisolvent than the support, having thereon a substantially unhardened gelatino silver halide, light sensitive emulsion adhered to the overlayer by means of a thin subbing layer no thicker than that having a coverage of about 0.020 gram per square foot and capable of being etched imagewise by a semisolvent for the plastic, said emulsion containing a tanning type silver halide developing agent and containing particulate solid matter having a hardness on the Moh scale between 5 and 10 and an average particle size of 2 to 20 microns in diameter at a concentration of about 50 to 750 grams per pound of gelatin in the emulsion.

17. A photosensitive element for preparing plastic relief printing plates by etching the plastic imagewise with a semisolvent for the plastic, comprising a cellulose acetate butyrate support having a thickness of about 8 to 40 mils and a solubility of about 14–18 grams per liter in the semisolvent, having thereon at least one cellulose acetate propionate overlayer having a solubility of about 7–11.5 grams per liter, having thereon a gelatino silver halide, light sensitive emulsion adhered to the overlayer by means of a thin subbing layer no thicker than that having a coverage of about 0.020 gram per square foot and capable of being etched imagewise by the semisolvent for the support, said emulsion containing finely divided particulate solid matter of a high degree of hardness.

18. A photosensitive element for preparing plastic relief printing plates by etching the plastic imagewise with a semisolvent for the plastic, comprising a cellulose acetate butyrate support having a thickness of about 8 to 40 mils and a solubility of about 14–18 grams per liter in the semisolvent, having thereon at least one cellulose acetate propionate overlayer having a solubility of about 7–11.5 grams per liter, having thereon a substantially unhardened gelatino silver halide, light sensitive emulsion adhered to the overlayer by means of a thin subbing layer no thicker than that having a coverage of about 0.020 gram per square foot and capable of being etched imagewise by the semisolvent for the support, said emulsion containing a tanning type silver halide developer and finely divided particulate solid matter of a high degree of hardness.

19. A photosensitive element for preparing plastic relief printing plates by etching the plastic imagewise with a semisolvent for the plastic, comprising a cellulose acetate butyrate support having a thickness of about 8 to 40 mils and a solubility of about 14–18 grams per liter in the semisolvent, having thereon at least one cellulose acetate propionate overlayer having a solubility of about 7–11.5 grams per liter, having thereon a substantially unhardened gelatino silver halide, light sensitive emulsion adhered to the overlayer by means of a thin subbing layer no thicker than that having a coverage of about 0.020 gram per square foot and capable of being etched imagewise by the semisolvent for the support, said emulsion containing a tanning silver halide developing agent and containing particulate solid matter having a hardness on the Moh scale between 5 and 10 and an average particle size of 2 to 20 microns in diameter.

20. A photosensitive element for preparing plastic relief printing plates by etching the plastic imagewise with a semisolvent for the plastic, comprising a cellulose ester support having a thickness of about 8 to 40 mils, having thereon at least one cellulose ester overlayer of less solubility in the semisolvent than the support, having thereon a gelatino silver halide, light sensitive emulsion adhered to the overlayer by means of a thin subbing layer no thicker than that having a coverage of about 0.020 gram per square foot and capable of being etched imagewise by a semisolvent for the plastic, said emulsion containing a silver halide tanning type developing agent and having a hardness on the Moh scale between 5 and 10 and an average particle size of 2 to 20 microns in diameter at a concentration of about 50 to 750 grams per pound of gelatin in the emulsion.

21. A relief printing plate having an image thereon comprising an organic plastic support having a thickness of about 8–40 mils in the image areas, laminated to a base, capable of being readily etched imagewise by a semisolvent for the plastic, having a gelatino-silver image layer containing inert particulate solid matter of a high degree of hardness, adhered to the image areas of the uppermost overlayer by means of a thin subbing layer no thicker than that having a coverage of about 0.020 g./sq. ft. and capable of being readily etched imagewise by said semisolvent for the organic plastic, said plate having the organic plastic etched to a depth of at least 0.005 inch in the deepest of the non-image areas of the organic plastic support by repeated cycles of (1) etching with said semisolvent for the organic plastic, (2) removing the semisolvent and (3) drying to form a relief image with line or dot areas substantially free from undercutting.

22. A relief printing plate having an image thereon comprising a cellulose ester support laminated to a base having a thickness of about 8–40 mils in the image areas, capable of being readily etched imagewise by a semisolvent for the cellulose ester, having a gelatino-silver image layer containing inert particulate solid matter of a high degree of hardness, adhered to the image area of the uppermost overlayer by means of a thin subbing layer no thicker than that having a coverage of about 0.020 g./sq.ft. and capable of being readily etched imagewise by said semisolvent for the cellulose ester, said plate having the cellulose ester etched to a depth of at least 0.005 inch in the deepest of the non-image areas of the cellulose ester support by repeated cycles of (1) etching with said semisolvent for the cellulose ester, (2) removing the semisolvent and (3) drying to form a relief image with line or dot areas substantially free from undercutting.

23. A relief printing plate having an image thereon comprising an organic plastic support having a thickness of about 8–40 mils in the image areas, laminated to a base, capable of being readily etched imagewise by a semisolvent for the plastic, having thereon at least one thin organic plastic overlayer of less solubility in the said semisolvent than the support and having a gelatino-silver image layer containing inert particulate solid matter of a high degree of hardness, adhered to the image areas of the uppermost overlayer by means of a thin subbing layer no thicker than that having a coverage of about 0.020 g./sq.ft. and capable of being readily etched imagewise by said semisolvent for the organic plastic, said plate having the organic plastic etched to a depth of at least 0.005 inch in the deepest of the non-image areas of the organic plastic support by repeated cycles of (1) etching with said semisolvent for the organic plastic, (2) removing the semisolvent and (3) drying to form a relief image with line or dot areas substantially free from undercutting.

24. A relief printing plate having an image thereon comprising a cellulose ester support laminated to a base, having a thickness of about 8–40 mils in the image areas, capable of being readily etched imagewise by a semisolvent for the cellulose ester, having thereon at least one thin cellulose ester overlayer of less solubility in the said semisolvent than the support and having a gelatino-silver image layer containing inert particulate solid matter of a high degree of hardness, adhered to the image area of the uppermost overlayer by means of a thin subbing layer no thicker than that having a coverage of about 0.020 g./sq.ft. and capable of being readily etched imagewise by said semisolvent for the cellulose ester, said plate having the cellulose ester etched to a depth of at least 0.005 inch in the deepest of the non-image areas of the cellulose ester support by repeated cycles of (1) etching with said semisolvent for the cellulose ester, (2) removing the semisolvent and (3) drying to form a relief image with line or dot areas substantially free from undercutting.

25. A relief printing plate having an image thereon comprising a cellulose ester support having a thickness of about 8–40 mils in the image areas, laminated to a base, capable of being readily etched imagewise by a semisolvent for the cellulose ester, and having a solubility of about 14–18 g./liter in the said semisolvent, having thereon at least one thin cellulose ester overlayer having a solubility of about 7–11.5 g./liter, having a gelatino-silver image layer containing particulate solid matter having a hardness on the Moh scale between 5 and 10 and an average particle size of 2 to 20 microns in diameter, adhered to the uppermost overlayer by means of a thin subbing layer no thicker than that having a coverage of 0.020 g./sq.ft. and capable of being readily etched imagewise by said semisolvent for the cellulose ester, said plate having the cellulose ester etched to a depth of at least 0.005 inch in the deepest of the non-image areas of the cellulose ester support by repeated cycles of (1) etching with said semisolvent for the cellulose ester, (2) removing the semisolvent and (3) drying to form a relief image with line or dot areas substantially free from undercutting.

26. A relief printing plate having an image thereon comprising a cellulose acetate butyrate support, having a thickness of about 8–40 mils in the image areas, laminated to a base, capable of being readily etched imagewise by a semisolvent for the cellulose acetate butyrate, and having a solubility of about 14–18 g./liter in the said semisolvent, having thereon at least one thin cellulose acetate propionate overlayer, having a solubility of about 7–11.5 g./liter and having a gelatino-silver image layer containing particulate solid matter having a hardness on the Moh scale between 5 and 10 and an average particle size of 2 to 20 microns in diameter, adhered to the image area of the uppermost layer by means of a thin subbing layer no thicker than that having a coverage of about 0.020 g./sq.ft. and capable of being readily etched imagewise by said semisolvent for the cellulose acetate butyrate, said plate having the cellulose acetate butyrate etched to a depth of at least 0.005 inch in the deepest of the non-image areas of the cellulose acetate butyrate support by repeated cycles of (1) etching with said semisolvent for the butyrate, (2) removing the semisolvent and (3) drying to form a relief image with line or dot areas substantially free from undercutting.

References Cited by the Examiner

UNITED STATES PATENTS

| | | | |
|---|---|---|---|
| 2,083,640 | 6/1937 | Couch et al. | 96—83 |
| 2,257,143 | 9/1941 | Wood | 96—36 |
| 3,036,916 | 5/1962 | Notley | 96—35 X |
| 3,043,695 | 7/1962 | Alles | 96—35 X |
| 3,062,648 | 11/1962 | Crawford | 96—35 |
| 3,148,064 | 9/1964 | Rauner et al. | 96—115 |

FOREIGN PATENTS

| | | |
|---|---|---|
| 780,218 | 7/1957 | Great Britain. |

NORMAN G. TORCHIN, *Primary Examiner.*

ALEXANDER D. RICCI, *Examiner.*

C. L. BOWERS, *Assistant Examiner.*